(12) United States Patent
Asao

(10) Patent No.: US 6,456,137 B1
(45) Date of Patent: Sep. 24, 2002

(54) SEMICONDUCTOR CIRCUIT, DELAY ADJUSTMENT METHOD THEREFOR AND LAYOUT METHOD THEREFOR

(75) Inventor: Kazuki Asao, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/717,231

(22) Filed: Nov. 22, 2000

(30) Foreign Application Priority Data

Nov. 24, 1999 (JP) ............................................. 11-332197

(51) Int. Cl.[7] ............................................... H03H 11/26
(52) U.S. Cl. ........................ 327/290; 327/285; 327/272
(58) Field of Search .................................... 327/290, 284, 327/285, 564, 565, 566, 269–272, 310, 311; 326/101; 333/222, 243

(56) References Cited

U.S. PATENT DOCUMENTS

| | | | | |
|---|---|---|---|---|
| 4,404,663 A | * | 9/1983 | Saeki et al. .................. 365/206 |
| 4,707,671 A | * | 11/1987 | Suzuki et al. ................... 333/1 |
| 4,849,751 A | * | 7/1989 | Barber et al. .......... 340/825.02 |
| 4,890,022 A | * | 12/1989 | Endo ........................... 327/261 |
| 5,003,273 A | * | 3/1991 | Oppenberg ..................... 333/1 |
| 5,306,967 A | * | 4/1994 | Dow .......................... 326/101 |
| 5,432,484 A | * | 7/1995 | Klas et al. ....................... 333/1 |
| 5,436,573 A | * | 7/1995 | Ogawa et al. ................ 326/17 |
| 5,475,690 A | * | 12/1995 | Burns et al. ............. 370/105.3 |
| 5,959,480 A | * | 9/1999 | Shoji .......................... 327/161 |
| 5,994,946 A | * | 11/1999 | Zhang ........................ 327/403 |
| 6,285,208 B1 | * | 9/2001 | Ohkubo ....................... 326/15 |

FOREIGN PATENT DOCUMENTS

JP A1 08-330934 12/1996

* cited by examiner

Primary Examiner—Timothy P. Callahan
Assistant Examiner—Hai L. Nguyen
(74) Attorney, Agent, or Firm—Foley & Lardner (57) ABSTRACT

First and second wires are disposed adjacent to each other. Even pairs of buffers and inverters are disposed on the wires. A buffer and an inverter in each of the pairs are disposed on the first or second wires respectively. The first and second wires are respectively divided to even wire sections by the even pairs and a device or terminal connected to the output side of the pairs. Lengths of the wire sections are equal to each other between adjacent wire sections of the first and second wires. Gaps between the first and second wires are equal to each other between each two wire sections from the input side of the first and second wires.

21 Claims, 6 Drawing Sheets

LENGTH OF WIRING

FIG. 1

(PRIOR ART)

FIG. 2

(PRIOR ART)

SEMICONDUCTOR CIRCUIT, DELAY ADJUSTMENT METHOD THEREFOR AND LAYOUT METHOD THEREFOR

BACKGROUND OF THE INVENTION

1. Field of the Invention

The present invention relates to a semiconductor circuit including multiple wires in which cross-talk occurs, a delay adjustment method therefor and a layout method therefor, and more particularly to a semiconductor Circuit aiming at suppressing a variation of delay time, a delay adjustment method therefor and a layout method therefor.

2. Description of the Related Art

Figure 1:
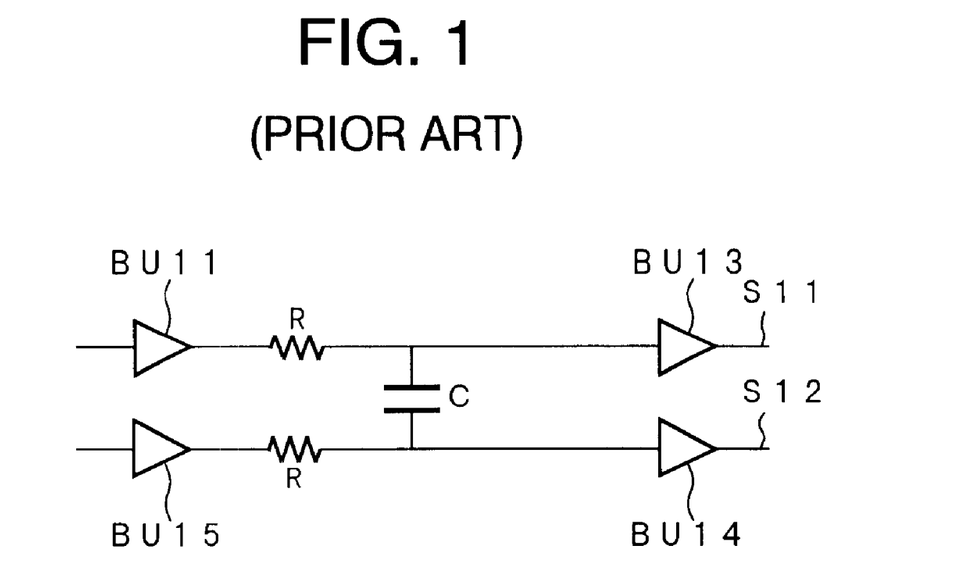
FIG. 1 is a circuit diagram showing a structure of a conventional semiconductor circuit.

The semiconductor circuit contains multiple signal lines disposed in parallel to each other and, for example, a device such as inverter and buffer are provided to them at a matching position in a signal propagation direction. FIG. 1 is a circuit diagram showing a structure of a conventional semiconductor circuit.

For example, two signal lines S11, S12 are disposed in parallel to each other. Buffers BU11 and BU13 are disposed on the signal line S11 in a signal propagation direction in this order. Then, buffers BU15 and BU14 are disposed on the signal line S12 in the signal propagation direction in this order. The buffers BU11 and BU15 are disposed at a position matching with each other in the signal propagation direction, namely, adjacent position. The buffers BU13 and BU14 are disposed at a position matching with each other in the signal propagation direction. Therefore, the length of wire between the buffers BU11 and BU13 is equal to the length of wire between the buffers BU15 and BU14.

A resistor having a resistance "R" parasitizes to each wire between the buffers BU11 and BU13, and between the buffers BU15 and BU14. Further, a capacitor having capacitance "C" parasitizes between wire between the buffers BU11 and BU13, and the wire between the buffers BU15 and BU14.

If a signal is inputted to the buffers BU11 and BU15 in the conventional semiconductor circuit having such a structure, the respective signals are driven by the buffers BU11 and BU15 and then inputted to the buffers BU13 and BU14. At this time, a delay occurs in signal propagation. If changing signals are inputted to both the signal lines S11 and S12, as compared to a case where a signal inputted to one signal line is not changed, the delay time is decreased by cross-talk if that input signal is in phase. If the input signal is in opposite phase, the delay is increased by the cross-talk.

Figure 2:
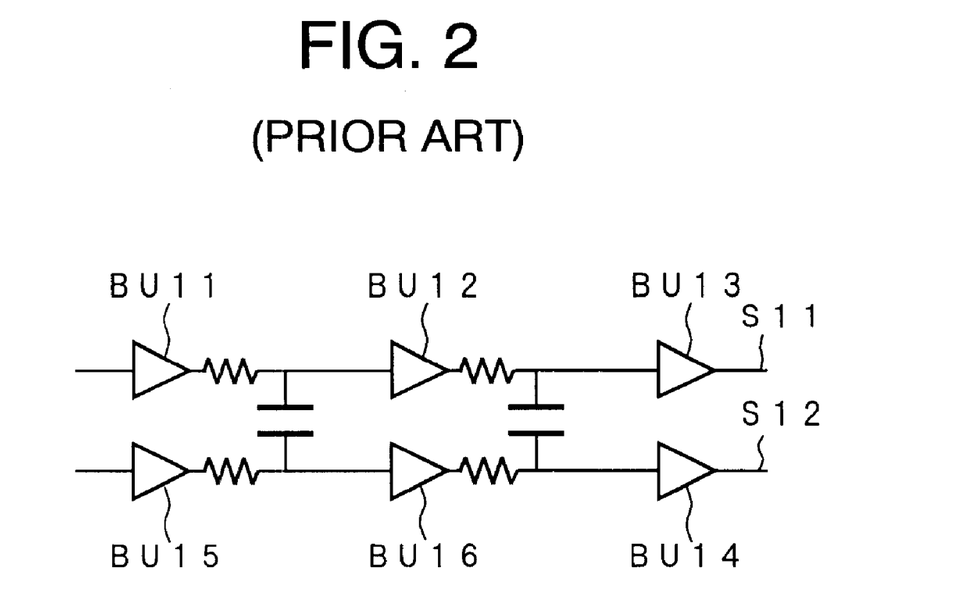
FIG. 2 is a circuit diagram showing a structure of a conventional semiconductor circuit in which it is intended to reduce a capacity between wires.

An above-described variation of the delay time becomes more evident as the capacitance between the wires is increased. Therefore, there is provided a semiconductor circuit in which the capacitance between the wires is reduced by providing another buffer between the buffers. FIG. 2 is a circuit diagram showing a structure of a conventional semiconductor circuit intended to reduce the capacitance between the wires.

In the conventional semiconductor circuit intended to reduce capacitance between the wires, a buffer BU12 is connected between the buffers BU11 and BU13 and a buffer BU16 is connected between the buffers BU15 and BU14.

Figure 3A:
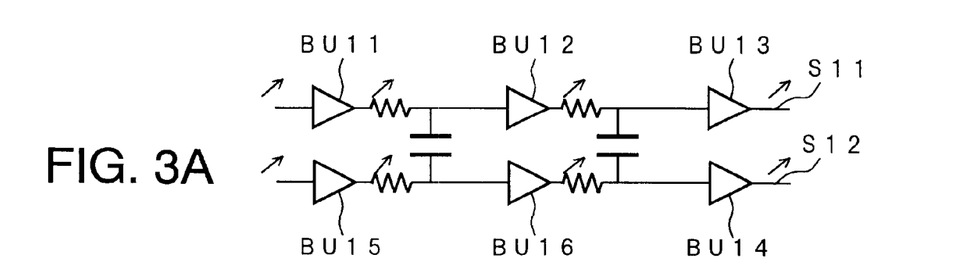
FIGS. 3A–3D are circuit diagrams showing an operation of the conventional semiconductor circuit shown in FIG. 2.
Figure 3B:
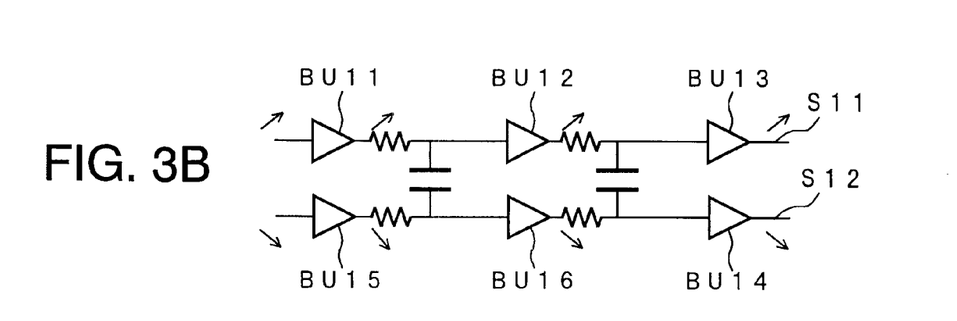
Figure 3C:
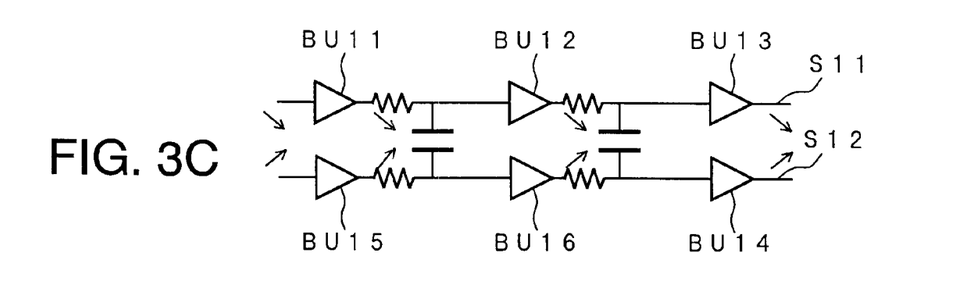
Figure 3D:
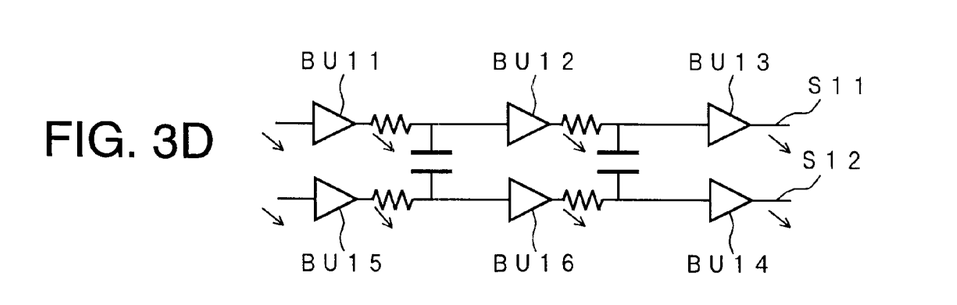

Next, an operation of the conventional semiconductor circuit having the above-described structure will be described. FIGS. 3A–3D are diagrams showing an operation of the conventional semiconductor circuit shown in FIG. 2. FIG. 3A is a circuit diagram showing an operation when input signals rise on both the signal lines S11 and S12. FIG. 3B is a circuit diagram showing an operation when a input signal rises on the signal line S11 while a signal falls on the signal S12. FIG. 3C is a circuit diagram showing an operation when the input signal falls on the signal line S11 while the signal rises on the signal line S12. FIG. 3D is a circuit diagram showing an operation when the input signals fall on both the signal lines S11, S12.

If both the signals propagated through the signal lines S11 and S12 rise, the signals propagated through the signal lines S11 and S12 are outputted from the buffers B11 and BU15 in non-inverted state as shown in FIG. 3A. Because these output signals are in phase with each other, a delay time until they are inputted to the buffers BU12 and BU16 is decreased by cross-talk as compared to a case where the mating signal is not changed.

After that both the signals are outputted from the buffers BU12 and BU16 in non-inverted state. Because these output signals are in phase, the delay time until they are inputted to the buffers BU13 and BU14 is further decreased by the cross-talk as compared to a case where the mating signal is not changed.

On the other hand, if a signal propagated through the signal line S11 rises while a signal propagated through the signal line S12 falls, signals propagated through the signal lines S11 and S12 are outputted from the buffers BU11 and BU15 in non-inverted state. Because these signals are in opposite phase, the delay time until they are inputted to the buffers BU12 and BU16 is increased by cross-talk as compared to a case where the mating signal is not changed.

After that, both the signals are outputted from the buffers BU12 and BU16 in non-inverted state. Because these output signals are in opposite phase, the delay time until they are inputted to the buffers BU13 and BU14 is further increased by the cross-talk as compared to a case where the mating signal is not changed.

If a signal propagated through the signal line S11 falls while a signal propagated through the Signal line S12 rises, the signals are changed in opposite phase to FIG. 3B as shown in FIG. 3C. If both signals propagated through the signal lines S11 and S12 fall, the signals are changed in opposite phase to FIG. 3A as shown in FIG. 3D.

By providing with the buffers BU12, BU16 in the conventional semiconductor circuit shown in FIG. 2, the driving performance is raised and the capacitance between wires is reduced so as to suppress a variation due to cross-talk.

To remove a timing shift generated by cross-talk between signals propagated through the adjacent two signal lines, such a semiconductor circuit having inverters to accelerate or retard propagation of signals has been proposed (Japanese Patent Application Laid-Open No. 8-330934).

However, in the conventional semiconductor circuit shown in FIG. 2, the delay time of a signal in phase is only decreased while the delay of a signal in opposite phase is only decreased because the buffers BU12 and BU16 added to the circuit shown in FIG. 1 are of positive logic. Thus, it is necessary to provide with a multiplicity of buffers to suppress the variation of the delay time. As a result, there exists a problem that production cost is increased or the delay is increased due to a switching delay of a buffer.

Although in the conventional semiconductor circuit proposed in Japanese Patent Application Laid-Open No. 8-330934, a generated timing shift can be reduced, there is such a problem that if a signal having no timing shift is inputted, the signal propagation is forced to be accelerated or retarded.

SUMMARY OF THE INVENTION

The object of the present invention is to provide a semiconductor circuit capable of preventing a variation of the delay time caused by cross-talk, a delay adjustment method therefor and a layout method therefor.

According to one aspect of the present invention, a semiconductor circuit comprises first and second wires disposed adjacent to each other, and even pairs of buffers and inverters. A buffer and an inverter in each of the pairs are disposed on the first or second wires respectively. The first and second wires are respectively divided to even wire sections by the even pairs and a device or terminal connected to the output side of the pairs. Lengths of the wire sections are equal to each other between adjacent wire sections of the first and second wires. Gaps between the first and second wires are equal to each other between each two wire sections from the input side of the first and second wires.

According to another aspect of the present invention, a semiconductor circuit comprises first and second wires disposed adjacent to each other, and even pairs of buffers and inverters. A buffer and an inverter in each of the pairs are disposed on the first or second wires respectively. The first and second wires are respectively divided to even wire sections by the even pairs and a device or terminal connected to the output side of the pairs. Resistances of the wire sections are equal to each other between adjacent wire sections of the first and second wires. Capacitance between the first and second wires are equal to each other between each two wire sections from the input side of the first and second wires.

According to another aspect of the present invention, a delay adjustment method for semiconductor circuit is a method for a semiconductor circuit comprising first and second wires disposed adjacent to each other, and even pairs of buffers and inverters, a buffer and an inverter in each of the pairs being disposed on the first or second wires respectively, and the first and second wires being respectively divided to even wire sections by the even pairs and a device or terminal connected to the output side of the pairs. The method comprises the steps of setting lengths of the wire sections equal to each other between adjacent wire sections of the first and second wires, and setting gaps between first and second wires equal to each other between each two wire sections from the input side of the first and second wires.

According to another aspect of the present invention, a delay adjustment method for semiconductor circuit is a method for a semiconductor circuit comprising first and second wires disposed adjacent to each other, and even pairs of buffers and inverters, a buffer and an inverter in each of the pairs being disposed on the first or second wires respectively, and the first and second wires being respectively divided to even wire sections by the even pairs and a device or terminal connected to the output side of the pairs. The method comprises the steps of setting resistances of the wire sections equal to each other between adjacent wire sections of the first and second wires, and setting capacitance between first and second wires equal to each other between each two wire sections from the input side of the first and second wires.

According to another aspect of the present invention, a layout method for semiconductor circuit is a method for a semiconductor circuit comprising first and second wires disposed adjacent to each other, and even pairs of buffers and inverters, a buffer and an inverter in each of the pairs being disposed on the first or second wires respectively, and the first and second wires being respectively divided to even wire sections by the even pairs and a device or terminal connected to the output side of the pairs. The method comprises the steps of setting lengths of the wire sections equal to each other between adjacent wire sections of the first and second wires, and setting gaps between first and second wires equal to each other between each two wire sections from the input side of the first and second wires.

According to another aspect of the present invention, a layout method for semiconductor circuit is a method for a semiconductor circuit comprising first and second wires disposed adjacent to each other, and even pairs of buffers and inverters, a buffer and an inverter in each of the pairs being disposed on the first or second wires respectively, and the first and second wires being respectively divided to even wire sections by the even pairs and a device or terminal connected to the output side of the pairs. The method comprises the steps of setting resistances of the wire sections equal to each other between adjacent wire sections of the first and second wires, and setting capacitance between first and second wires equal to each other between each two wire sections from the input side of the first and second wires.

According to these aspects of the present invention, if an output signal propagated through one wire rises while an output signal propagated through the other wire falls by the first pair of buffer and inverter, the delay time is increased by cross-talk. However, by the second pair of the buffer and inverter, the both output signals rise or fall uniformly. Therefore, the delay time is decreased by cross-talk. Because an absolute value of an increase of the delay time is equal to that of a decrease thereof, a variation of the delay time, which conventionally occurs in a signal outputted from continuous even wire sections, can be prevented. On the other hand, if output signals propagated through both the wires rise or fall uniformly by the first pair of the buffer and inverter, the delay time is decreased by cross-talk. However, one of the aforementioned output signals rises while the other one falls by the second pair of the buffer and inverter, so that the delay time is increased by cross-talk. Therefore, in this case also, the variation of the delay time, which conventionally occurs in a signal outputted from continuous even wire sections, can be prevented. That is, in any case, the increase and decrease of the delay time are killed by each other throughout the continuous even wire sections. Consequently, an entire variation of the delay time can be prevented, so that adjustment of signal timing can be carried out easily.

DETAILED DESCRIPTION OF THE PREFERRED EMBODIMENTS

Figure 4:
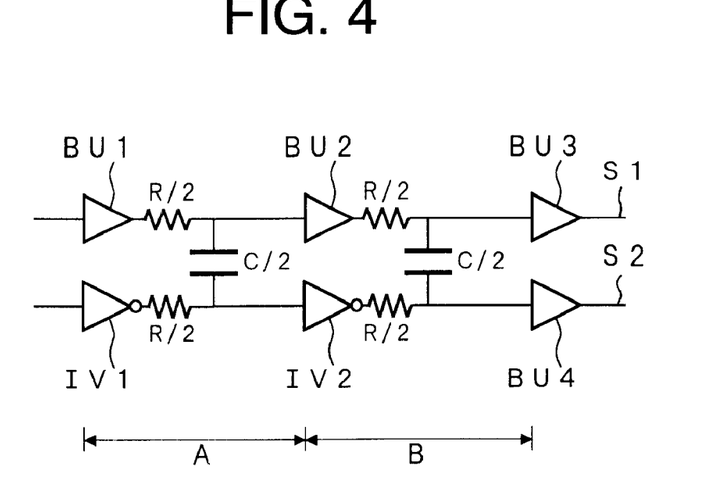
FIG. 4 is a circuit diagram showing a structure of a semiconductor circuit according to a first embodiment of the present invention.

Hereinafter the preferred embodiments of the present invention will be described in detail with reference to the accompanying drawings. FIG. 4 is a circuit diagram showing a structure of a semiconductor circuit according to a first embodiment of the present invention. According to the first embodiment, two signal lines S1 and S2 are disposed in parallel to each other. Buffers BU1, BU2 and BU3 are disposed at the same interval in this order in a signal propagation direction on the signal line S1. Inverters IV1 and IV2, and a buffer BU4 are disposed at the same interval in this order in the signal propagation direction on the signal line S2. The buffer BU1 and the inverter Iv1 are disposed at a position matching with each other in the aforementioned signal propagation direction, The buffer BU2 and the inverter IV2 are disposed at a position matching with each other in the signal propagation direction. The buffer BU3 and the buffer BU4 are disposed at a position matching with each other in the signal propagation direction. Therefore, length of wire between the buffers BU1 and BU2, length of wire between the inverters IV1 and IV2, length of wire between the buffers BU2 and BU3, and length of wire between the inverter IV2 and the buffer BU4 are the same.

According to the first embodiment, as compared to the resistance "R" and Capacitance "C" in the conventional semiconductor circuit shown in FIG. 1, wiring resistance between the buffers BU1 and BU2, wiring resistance between the inverters IV1 and IV2, wiring resistance between the buffers BU2 and BU3, and wiring resistance between the inverter IV2 and the buffer BU4 are set to the same value "R/2". Capacitance between the wire between the buffers BU1 and BU2 and the wire between the inverters IV1 and IV2, and capacitance between the wire between the buffers BU2 and BU3 and the wire between the inverter IV2 and the buffer BU4 are set to the same value "C/2".

Figure 5:
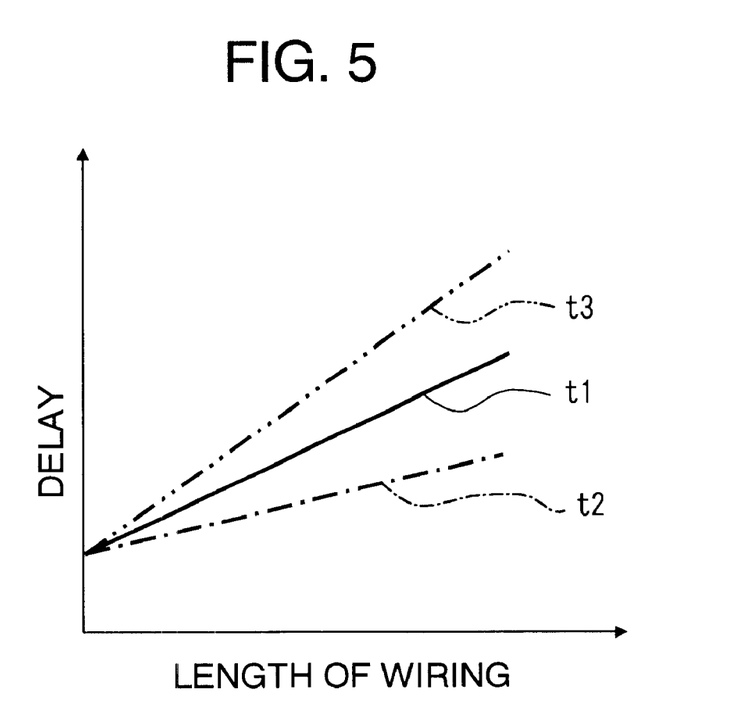
FIG. 5 is a graph for explaining a driving power with a relation between wire length and delay time.

Delay times by each of the respective devices including the buffers BU1, BU2 and inverters IV1, IV2 have a following relationship. In FIG. 5, the axis of abscissa indicates length of wire and the axis of ordinate indicates a delay time so as to explain a driving performance. In FIG. 5, a solid line indicates a delay time t1 of a signal line when a mating signal propagated through the other signal line does not change. A dot and dash line indicates a delay time t2 of a signal line when a mating signal propagated through the other signal line changes in the same phase. A two-dot and dash line indicates a delay time t3 of a signal line when a mating signal propagated through the other signal line changes in opposite phase.

For the buffers BU1, BU2 and inverters IV1, IV2, the following expression 1 holds regardless of the wire length L where the length of wire connected to an output end is assumed to be L.

$$t3-t1=t1-t2=t(L) \tag{1}$$

Then, according to the first embodiment, the respective delay time (L) of the buffers BU1, BU2 and inverters IV1, IV2 are set equally. That is, each output end driving performance of the buffers BU1, BU2 and the driving performance of the inverters IV1, IV2 are set equally.

Figure 6A:
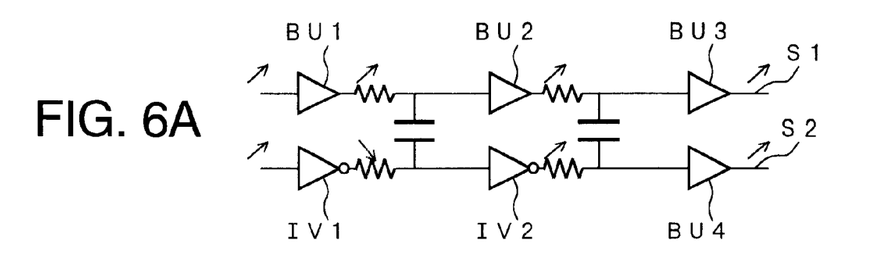
FIGS. 6A–6D are circuit diagrams showing an operation of a semiconductor circuit according to the first embodiment of the present invention.
Figure 6B:
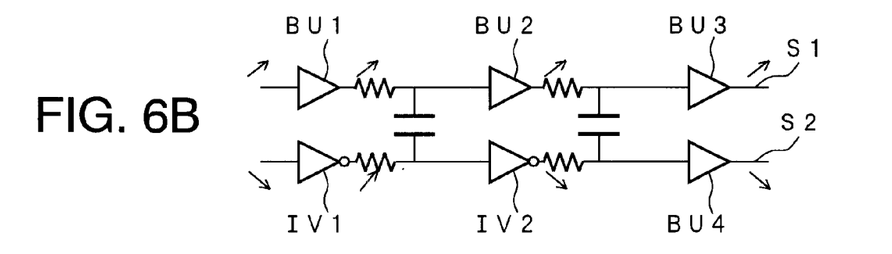
Figure 6C:
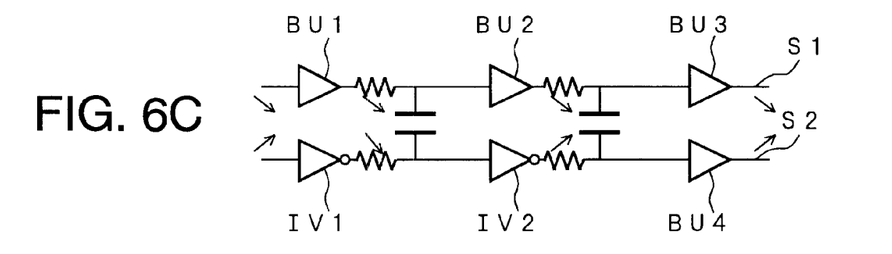
Figure 6D:
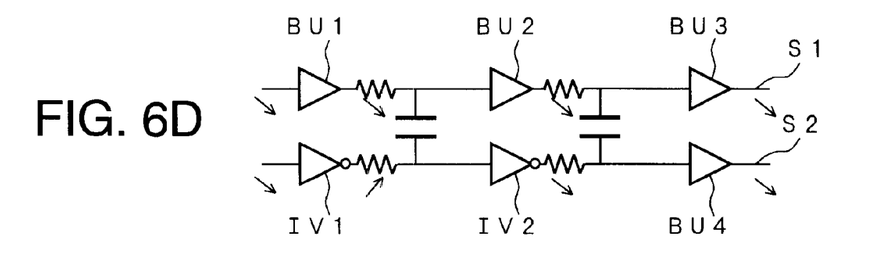

Next, an operation of the semiconductor circuit of the first embodiment having the above described structure will be described. FIGS. 6A–6D are diagrams showing an operation of the semiconductor circuit of the first embodiment of the present invention. FIG. 6A is a circuit diagram showing an operation when input signals rise on both the signal lines S1 and S2. FIG. 6B is a circuit diagram showing an operation when an input signal rises on the signal line S1 while the signal falls on the signal line S2. FIG. 6C is a circuit diagram showing an operation when the input signal rises on the signal line S1 while the signal falls on the signal line S2. FIG. 6D is a circuit diagram showing an operation when the input signals fall on both the signal lines S1 and S2.

When both signals propagated through the signal lines S1 and S2 rise, as shown in FIG. 6A, a signal propagated through the signal line S1 is outputted from the buffer BU1 in non-inverted state and a signal propagated through the signal line S2 is outputted from the inverter IV1 in inverted state. Because these signals are in opposite phase to each other, a delay time until they are inputted to the buffer BU2 and the inverter IV2 is increased by cross-talk as compared to a case where the mating signal is not changed. However, increases of the delay times for both these signals are equal because the output side driving performance of the buffer BU1. and the driving performance of the inverter IV1 are the same and the wire lengths thereof are the same.

After that, the signal propagated through the signal line S1 is outputted from the buffer BU2 in non-inverted state, and the signal propagated through the signal line S2 is outputted from the inverter IV2 in inverted state. Because these signals are in phase with each other, delay time until they are inputted to the buffers BU3 and BU4 is decreased by cross-talk as compared to a case where the mating signal is not changed. Because the output side driving performance of the buffer BU2 and the driving performance of the inverter IV2 are the same and the wire lengths thereof are the same, decreases of the delay times of both the signals are equal.

At this time, the wire resistance between the buffers BU1 and BU2, the wire resistance between the inverters IV1 and IV2, the wire resistance between the buffers BU2 and BU3, and the wire resistance between the inverters IV2 and the buffer BU4 are set to the same value "R/2". Then, the capacitance between the wire between the buffers BU1 and BU2 and the wire between the inverters IV1 and IV2, and the capacitance between the wire between the buffers BU2 and SU3 and the wire between the inverters IV2 and the buffer BU4 are set to the same value "C/2". Thus, an absolute value of the increase of the delay time is equal to an absolute value of the decrease of the delay time. Therefore, a variation of the delay time is killed by each other between the wire section A and a wire section B shown in FIG. 4, so that signals having no variation of the delay time are inputted to the buffers BU3 and BU4.

On the other hand, if a signal propagated through the signal line S1 rises while a signal propagated through the signal line S2 falls, as shown in FIG. 6B, the signal propagated through the signal line S1 is outputted from the buffer BU1 in non-inverted state and the signal propagated through the signal line S2 is outputted from the inverter IV1 in inverted state. Because these output signals are in phase with each other, the delay time until they are inputted to the buffer BU2 and the inverter IV2 is decreased by cross-talk as compared to a case where the mating signal is not changed. At this time, because the output side driving performance of the buffer BU1 and the driving performance of the inverter IV1 are the same and the wire lengths thereof are the same, decreases of the delay time of both the signals are equal.

After that, the signal propagated through the signal line S1 is outputted from the buffer BU2 in non-inverted state, and the signal propagated through the signal line S2 is outputted from the inverter IV2 in inverted state. Because these signals are in opposite phase to each other, delay time until they are inputted to the buffers BU3 the BU4 is increased by cross-talk as compared to a case where the mating signal is not changed. Because the output side driving performance of the buffer BU2 and the driving performance of the inverter IV2 are the same and the wire lengths thereof are the same, the increases of the delay times of both the signals are equal.

At this time, the absolute value of the decrease of the aforementioned delay time is equal to the absolute value of the increase like a case where both the signals propagated through the signal lines S1 and S2 rise. Thus, the variation of the delay time is killed by each other between the wire section A and the wire section B, so that signals having no variation of the delay time are inputted to the buffers BU3 and BU4.

If a signal propagated through the signal line S1 falls while a signal propagated through the signal line S2 rises, as shown in FIG. 6C, the signals are changed in opposite phase to the case shown in FIG. 6B. Therefore, in this case also, the absolute value of the increase of the delay time by cross-talk is equal to the absolute value of the decrease. Thus, the variation of the delay time is killed by each other between the wire section A and the wire section B, so that signals having no variation of the delay time are inputted to the buffers BU3 and BU4.

If both signals propagated through the signal lines S1 and S2 fall, as shown in FIG. 6D, the signals are changed in opposite phase to the case shown in FIG. 6A. Therefore, the absolute value of the increase of the delay time by the cross-talk is equal to the absolute value of the decrease. Thus, the variation of the delay time is killed by each other between the wire section A and the wire section B. so that signals having no variation of the delay time are inputted to the buffers BU3 and BU4.

As described above, according to the first embodiment, variations of the delay time occur in opposite directions between the wire section A and the wire section B, and the absolute amounts of the variations are equal. Thus, the delay times are killed by each other, so that a signal, which is changed at a designed timing, can be propagated.

Figure 7:
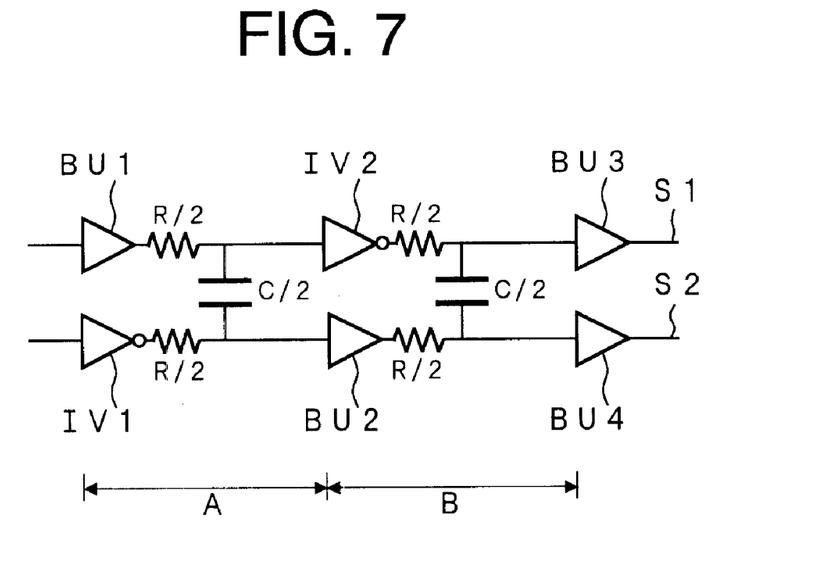
FIG. 7 is a circuit diagram showing a structure of a semiconductor circuit according to a second embodiment of the present invention.

Next, a second embodiment of the present invention will be described. According to the second embodiment, the buffer BU2 and the inverter IV2 in the first embodiment are exchanged with each other. FIG. 7 is a circuit diagram showing a structure of a semiconductor circuit according to the second embodiment of the present invention.

According to the second embodiment, the inverter IV2 is disposed between the buffer BU1 and the buffer BUY of the signal line S1 and then, the buffer BU2 is disposed between the inverter IV1 and the buffer BU4 of the signal line 2. Because positions, characteristics and the like of the other components are the same as the first embodiment, a detailed description thereof is omitted.

Figure 8:
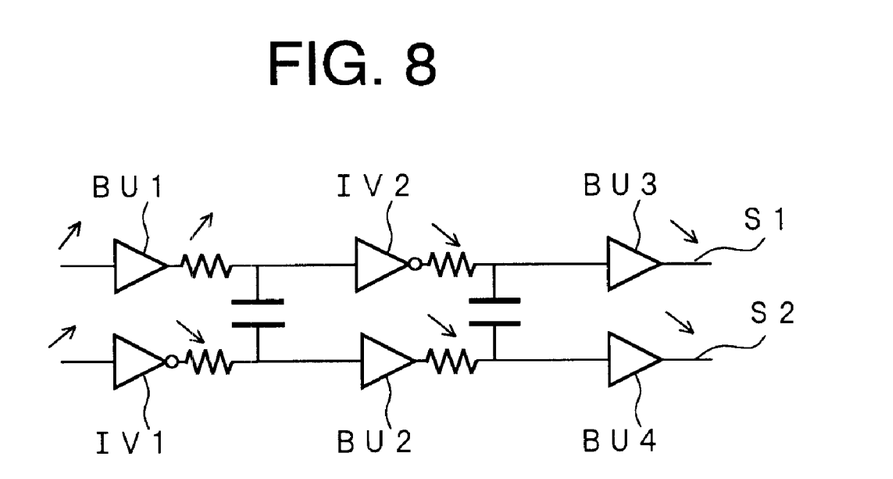
FIG. 8 is a circuit diagram showing an operation when signal rises on both the signal lines S1 and S2 in the semiconductor circuit according to the second embodiment of the present invention.

FIG. 8 is a circuit diagram showing an operation when signals rise on both the signal lines S1, S2 in the semiconductor circuit according to the second embodiment of the present invention.

When both signals propagated through the signal lines S1 and S2 rise, as shown in FIG. 8, a signal propagated through the signal line S1 is outputted from the buffer BU1 in non-inverted state and a signal propagated through the signal line S2 is outputted from the inverter IV1 in inverted state. Because these signals are in opposite phase to each other, a delay time until they are inputted to the buffer BU2 and the inverter IV2 is increased by cross-talk as compared to a case where the mating signal is not changed. At this time, increases of the delay times for both these signals are equal because the output side driving performance of the buffer BU1 and the driving performance of the inverter IV1 are the same and the wire lengths thereof are the sate.

After that, the signal propagated through the signal line S1 is outputted from the inverter IV2 in inverted state, and the signal propagated through the signal line S2 is outputted from the buffer BU2 in non-inverted state. Because these signals are in phase with each other, delay time until they are inputted to the buffers BU3 and BU4 is decreased by cross-talk as compared to a case where the mating signal is not changed. Because the output side driving performance of the buffer SU2 and the driving performance of the inverter IV2 are the same and the wire lengths thereof are the same, decreases of the delay times of both the signals are equal.

At this time, the wire resistance between the buffers BU1 and the inverter IV2, the wire resistance between the inverters IV1 and the buffer BU2, the wire resistance between the inverter IV2 and the buffer BU3, and the wire resistance between the buffers BU2 and BU4 are set to the same value "R/2". Then, the capacitance between the wire between the buffer BU1 and the inverter IV2 and the wire between the inverter IV1 and the buffer BU2, and the capacitance between the wire between the inverter IV2 and the buffer BU3 and the wire between the buffers BU2 and BU4 are set to the same value "C/2". Thus, an absolute value of the increase of the delay time is equal to an absolute value of the decrease of the delay time. Therefore, a variation of the delay time is killed by each other between the wire section A and the wire section a shown in FIG. 7, so that signals having no variation of the delay time are inputted to the buffers BU3 and BU4.

In any case where a signal rises on the signal line S1 while a signal falls on the signal line S2, where a signal falls on the signal line S1 while a signal rises on the signal line S2 and where the signals fall on both the signal lines, the variation of the delay time is killed by each other between the wire section A and the wire section B, so that signals having no variation of the delay time are inputted to the buffers BU3 and BU4.

Therefore, according to the second embodiment also, signals, which are changed at a designed timing, can be propagated. Meanwhile the first embodiment may be applied to a case where a signal is not inverted in the wire sections A and B, while the second embodiment may be applied to a case where a signal is inverted in the wire sections A and B.

Figure 9:
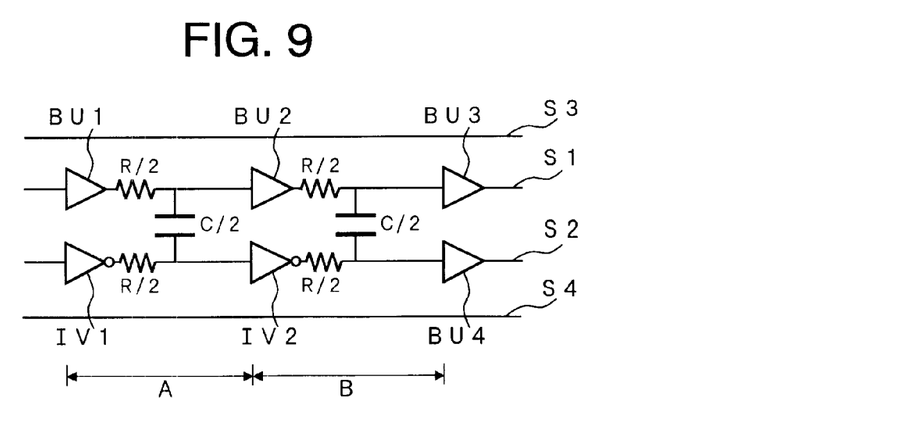
FIG. 9 is a circuit diagram showing a structure of a semiconductor circuit according to a third embodiment of the present invention.

Next, a third embodiment of the present invention will be described. According to the third embodiment, two shield wires are disposed so as to sandwich the signal lines S1 and S2 of the first embodiment. FIG. 9 is a circuit diagram showing a structure of a semiconductor circuit according to the third embodiment of the present invention.

According to the third embodiment, a shield wire S3 is disposed so as to sandwich the signal line S1 with the signal line S2, while a shield wire S4 is disposed so as to sandwich the signal line S2 with the signal line S1. The shield wires S3 and 54 are supplied with a fixed potential such as grounding potential, power supply potential or the like, which is not changed. In the wire sections A and B, capacitance between the signal line S3 and the signal line S1 is equal to that between the signal line S4 and the signal line S2. For example, a distance between the signal lines S1 and S3 is equal to that between the signal lines S2 and 54.

In the third embodiment having such a structure, noise from outside is interrupted by the shield wires S3 and S4. Further, because signal propagated through the shield wires S3 and S4 are not changed, no cross-talk is generated from these to the signal lines S1 and S2. Further, because the capacitances on both sides are equal, no variation of the delay occurs between two signals propagated through the respective signal lines S1 and S2.

Figure 10:
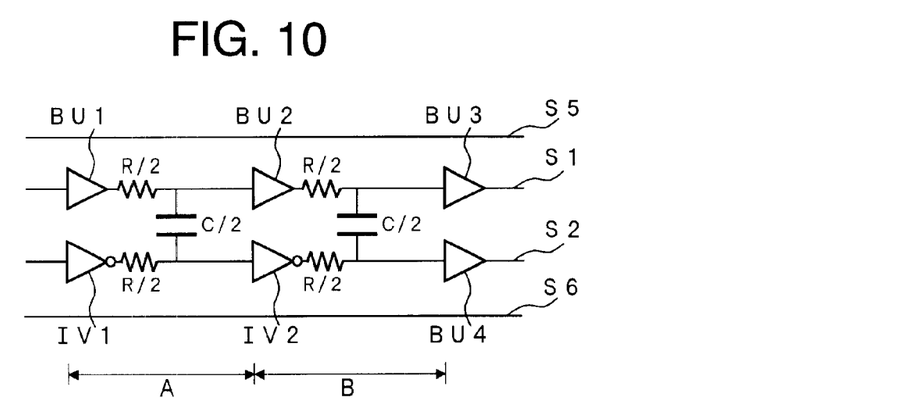
FIG. 10 is a circuit diagram showing a structure of a semiconductor circuit according to a fourth embodiment of the present invention.

Next, a fourth embodiment of the present invention will be described. According to the fourth embodiment, two wires, each in which potential is not changed during a period in which a signal propagated through the signal line S1 and/or the signal line S2 is changed, are provided so as to sandwich the signal lines S1 and S2 of the first embodiment. FIG. 10 is a circuit diagram showing a structure of a semiconductor circuit according to the fourth embodiment of the present invention.

According to the fourth embodiment, a wire S5 is disposed so as to sandwich the signal line S1 with the signal line S2, while a wire S6 is disposed so as to sandwich the signal line S2 with the signal line S1. The wires S5 and S6 include various devices such as inverter and buffer. In a period when signal propagated through the signal lines S1 and S2 are changed in the wire sections A and B, signals propagated through the signal lines S5 and S6 are not changed. Further, in the wire sections A and B, capacitance between the signal line S5 and the signal line S1 is equal to capacitance between the signal line S6 and the signal line S2. For example, a distance between the signal lines S1 and S5 is equal to that between the signal lines S2 and S6.

In the fourth embodiment having such a structure, noise from outside is interrupted by the wires S5 and S6. Further, because signals propagated through the wires S5 and S6 are not changed in the wire sections A and B in a period in which signals propagated through the signal lines S1 and S2 are changed, no cross-talk is generated from these to the signal lines S1 and S2. Further, because the capacitances on both sides are equal, no variation of the delay occurs between two signals propagated through the respective signal lines S1 and S2.

The devices included in the wires S5 and S6 may be disposed inside or outside the wire sections A and B. if a signal is not changed in the aforementioned predetermined period.

Figure 11:
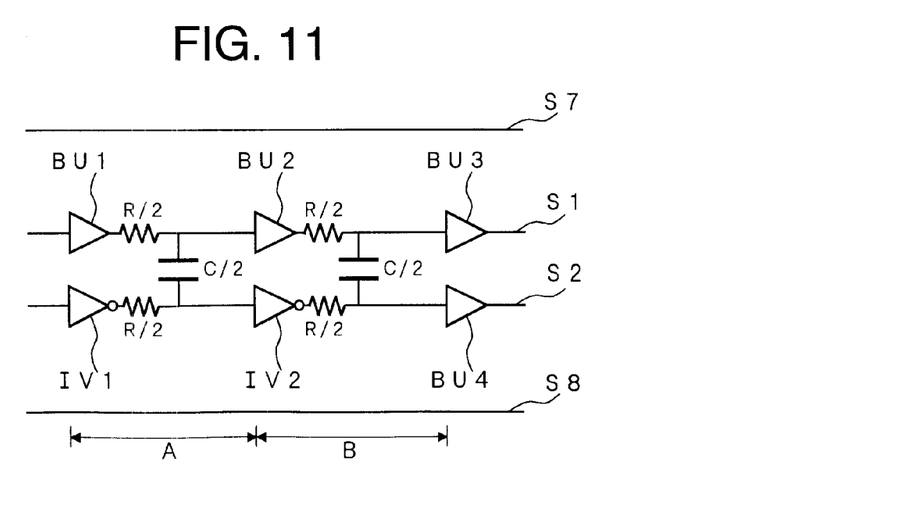
FIG. 11 is a circuit diagram showing a structure of a semiconductor circuit according to a fifth embodiment of the present invention.

Next, a fifth embodiment of the present invention will be described. According to the fifth embodiment, two wires are disposed far so as to sandwich the signal lines S1 and S2 in the first embodiment. FIG. 11 is a circuit diagram showing a structure of a semiconductor circuit according to the fifth embodiment of the present invention.

According to the fifth embodiment, a wire S7 is disposed so as to sandwich the signal line S1 with the signal line S2, and a wire S8 is disposed so as to sandwich the signal line 62 with the signal line S1. The wires S7 and S8 include various devices such as inverter and buffer. In the wire sections A and B, signals propagated through the signal lines 57 and SB are changed even in a period in which signals propagated through the signal lines S1 and S2 are changed. However, the signal line S7 is so far from the signal line S1, that capacitance therebetween is very small as compared to capacitance between the signal lines S1 and S2. Likewise, the signal line S8 is so far from the signal line S2, that capacitance therebetween is very small as compared to capacitance between the signal lines S1 and S2.

According to the fifth embodiment having such a structure, distances between the wires S7 and S8 and the signal lines S1 and S2 are very large. Thus, even if signals propagated through the wires S7 and SB are changed, cross-talk between those wires is very small. Therefore, according to the fifth embodiment also, no variation of the delay occurs between two signals propagated through the respective signal lines S1 and S2.

Although the distances between the wires S1, S2 and the wires S7, S8 is preferred to be as large as possible from viewpoints of cross-talk prevention, these distances may be restricted by viewpoints of chip area or the like. In this case, it is permissible to permit an occurrence of the crosstalk between the wires S1 and S7 or between the wires S2 and S8 within a range which user permits.

In any one of the respective embodiments, it is permissible to place a plurality of wires above or below the wires S1 and S2 such that they cross the wires S1 and S2. At this time, capacitance between different layers is preferred to be similar between the wire sections A and B. Thus, the quantity of wires provided above or below in the wire section A is preferred to coincide with or similar to the quantity of wires provided above or below in the wire section B. However, the present invention is not restricted to this.

What is claimed is:

1. A semiconductor circuit comprising:
    at least a first wire and a second wire disposed substantially parallel to each other without another wire in between the first and second wires; and
    an even number of buffer/inverter pairs, each pair comprising a buffer and an inverter,
        the buffer and the inverter in each of said pairs being disposed on said first or second wires, respectively, wherein the buffer and the inverter are aligned along an axis that is approximately perpendicular to the first and second wires,
        said first and second wires being respectively divided into even length wire sections by said buffers and inverters of each of said pairs and a device or terminal connected to an output side of said wires,
        said wire sections having length dimensions, wherein a length dimension of a wire section in the first wire is equal to a length dimension of an adjacent wire section in the second wire.

2. The semiconductor circuit according to claim 1 wherein said buffers are connected in series throughout said wire sections on the first wire, and
    said inverters are connected in series throughout said wire sections on the second wire.

3. The semiconductor circuit according to claim 1 wherein buffers and inverters from said pairs are connected alternately in series throughout said wire sections on the first wire, and
    the corresponding inverters and buffers from said pairs are connected alternately in series throughout said wire sections on the second wire.

4. The semiconductor circuit according to claim 1 wherein each of said pairs comprises a buffer and an inverter having equal driving performances to each other.

5. The semiconductor circuit according to claim 1 comprising:
    a first shield wire provided at a position for sandwiching said first wire between said first shield wire and said second wire; and a second shield wire provided at a position for sandwiching said second wire between said second shield wire and said first wire, wherein a capacitance between said first wire and said first shield wire is equal to a capacitance between said second wire and said second shield wire in each of said wire sections.

6. The semiconductor circuit according to claim 1 comprising:
a third wire provided at a position for sandwiching said first wire between said third wire and said second wire; and
a fourth wire provided at a position for sandwiching said second wire between said fourth wire and said first wire, wherein a capacitance between said first wire and said third wire is equal to a capacitance between said second wire and said fourth wire in each of said wire sections, and wherein signals propagated through said third and fourth wires are not changed in a period in which signals propagated through said first and second wires are changed.

7. The semiconductor circuit according to claim 1,
wherein said wire sections have resistances, wherein a resistance of a wire section of the first wire is equal to a resistance of an adjacent wire section of the second wire, and
wherein a capacitance between a wire section of the first wire and an adjacent wire section of the second wire is equal to a capacitance between another wire section of the first wire and an adjacent wire section of the second wire.

8. A delay adjustment method for a semiconductor circuit, said semiconductor circuit comprising a first wire and a second wire disposed adjacent to each other without another wire in between the first and second wires, and an even number of pairs of buffers and inverters, a buffer and an inverter in each of said pairs being disposed on said first and second wires, respectively, wherein the buffer and the inverter for each pair are aligned along an axis that is approximately perpendicular to the first and second wires, and said first and second wires being respectively divided into even length wire sections by said pairs and a device or terminal connected to an output side of said pairs, said delay adjustment method comprising the steps of:
setting lengths of each two adjacent wire sections of said first and second wires to be equal to each other; and
setting distances between each two adjacent wire sections of said first and second wires to be equal.

9. The delay adjustment method for a semiconductor circuit according to claim 8 wherein
said buffers are connected in series throughout said wire sections on the first wire, and
said inverters are connected in series throughout said wire sections on the second wire.

10. The delay adjustment method for a semiconductor circuit according to claim 8 wherein
said buffers and inverters are connected alternately in series throughout said wire sections on the first wire, and
the corresponding inverters and buffers, which pair with said buffers or inverters provided on the first wire, are connected alternately in series throughout said wire sections on the other second wire.

11. The delay adjustment method for a semiconductor circuit according to claim 8 wherein each of said pairs comprise a buffer and an inverter having equal driving performances to each other.

12. The delay adjustment method for a semiconductor circuit according to claim 8 further comprising the steps of:
providing a first shield wire at a position for sandwiching said first wire with said second wire; and
providing a second shield wire at a position for sandwiching said second wire with said first wire, wherein a capacitance between said first wire and said first shield wire is equal to a capacitance between said second wire and said second shield wire for each of said wire sections.

13. The delay adjustment method for a semiconductor circuit according to claim 8 further comprising the steps of:
providing a third wire at a position for sandwiching said first wire with said second wire, a signal propagated through said third wire being not changed in a period in which signals are propagated through said first and second wires; and
providing a fourth wire at a position for sandwiching said second wire with said first wire, a signal propagated through said fourth wire being not changed in a period in which signals are propagated through said first and second wires, and wherein a capacitance between said first wire and said third wire is equal to a capacitance between said second wire and said fourth wire in each of said wire sections.

14. A delay adjustment method for a semiconductor circuit according to claim 8, wherein said delay adjustment method further comprises the steps of:
setting resistances of each two adjacent wire sections of said first and second wires to be equal; and
setting a capacitance between the first and second wires to be equal for each two adjacent wire sections from an input side of said first and second wires.

15. A layout method for a semiconductor circuit, said semiconductor circuit comprising a first wire and a second wire disposed substantially parallel to each other without another wire in between the first and second wires, and an even number of pairs of buffers and inverters, a buffer and an inverter in each of said pairs being disposed on said first or second wires, respectively, wherein the buffer and the inverter for each said pair are aligned along an axis that is approximately perpendicular to said first and second wires, and said first and second wires being respectively divided to even length wire sections by said pairs and a device or terminal connected to an output side of said pairs, said layout method comprising the steps of:
setting lengths adjacent wire sections of said first and second wires to be equal; and
setting distances between each two adjacent wire sections from an input side of said first and second wires to be equal.

16. The layout method for a semiconductor circuit according to claim 15 wherein
said buffers are connected in series throughout said wire sections on the first wire, and
said inverters are connected in series throughout said wire sections on the second wire.

17. The layout method for a semiconductor circuit according to claim 15 wherein
said buffers and inverters are connected alternately in series throughout said wire sections on the first wire, and
the corresponding inverters and buffers, which pair with said buffers or inverters provided on said first wire, are connected alternately in series throughout said wire sections on the second wire.

18. The layout method for a semiconductor circuit according to claim 15 wherein each said pair comprises a buffer and an inverter having equal driving performances to each other.

19. The layout method for a semiconductor circuit according to claim 15 further comprising the steps of:
providing a first shield wire at a position for sandwiching said first wire with said second wire; and
providing a second shield wire at a position for sandwiching said second wire with said first wire, wherein a capacitance between said first wire and said first shield wire is equal to a capacitance between said second wire and said second shield wire for each of said wire sections.

20. The layout method for a semiconductor circuit according to claim 15 further comprising the steps of;
providing a third wire at a position for sandwiching said first wire with said second wire, wherein a signal propagated through said third wire is not changed in a period in which signals are propagated through said first and second wires; and
providing a fourth wire at a position for sandwiching said second wire with said first wire, wherein a signal propagated through said fourth wire is not changed in a period in which signals are propagated through said first and second wires, and a capacitance between said first wire and said third wire is equal to a capacitance between said second wire and said fourth wire for each of said wire sections.

21. A layout method for a semiconductor circuit according to claim 15, said layout method further comprising the steps of:
setting resistances of adjacent wire sections of said first and second wires to be equal to each other; and
setting a capacitance between each two adjacent wire sections from an input side of said first and second wires to be equal.

* * * * *